(12) United States Patent
Guiraud et al.

(10) Patent No.: US 7,130,179 B2
(45) Date of Patent: Oct. 31, 2006

(54) SWITCHING DEVICE PROVIDED WITH POLARITY-INVERTING MEANS

(75) Inventors: Lionel Guiraud, St. Aubin-sur-Mer (FR); Patrick Leclerc, Langrune-sur-Mer (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 271 days.

(21) Appl. No.: 10/278,287

(22) Filed: Oct. 23, 2002

(65) Prior Publication Data

US 2003/0085718 A1 May 8, 2003

(30) Foreign Application Priority Data

Oct. 25, 2001 (FR) .................................. 01 13827

(51) Int. Cl.
*H02P 11/00* (2006.01)
(52) U.S. Cl. ...................................... 361/245; 361/246
(58) Field of Classification Search .................. 361/77, 361/119, 82, 84, 245, 246; 341/154, 133, 341/136, 118, 347; 324/631; 348/192
See application file for complete search history.

(56) References Cited

U.S. PATENT DOCUMENTS

| | | | | |
|---|---|---|---|---|
| 4,818,988 A | * | 4/1989 | Cooperman et al. | 340/2.29 |
| 4,896,296 A | * | 1/1990 | Turner et al. | 326/38 |
| 5,200,751 A | | 4/1993 | Smith | 341/347 |
| 5,444,740 A | * | 8/1995 | Mizukami et al. | 375/286 |
| 5,790,048 A | * | 8/1998 | Hsieh et al. | 340/2.26 |
| 5,903,613 A | * | 5/1999 | Ishida | 375/340 |
| 6,493,479 B1 | * | 12/2002 | Briggs | 385/17 |
| 2002/0020905 A1 | * | 2/2002 | McCormack et al. | 257/686 |

FOREIGN PATENT DOCUMENTS

| EP | 0162994 A1 | 5/1984 |
|----|-----------|--------|
| EP | 0265029 A1 | 2/1987 |

OTHER PUBLICATIONS

TZA3019 2.5 Gbits/s dual postamplifier with level detectors and 2x2 switch; Jun. 25, 2001, Philips.

* cited by examiner

*Primary Examiner*—Stephen W. Jackson
*Assistant Examiner*—Danny Nguyen
(74) *Attorney, Agent, or Firm*—Aaron Waxler; Paul Im

(57) ABSTRACT

The invention relates to a switching device comprising programmable compensation means which are associated with the input/output connections for inverting the polarity of the input/output connections when said connections present a polarity inversion which is inherent in the conception of the circuits.

5 Claims, 3 Drawing Sheets

SWITCHING DEVICE PROVIDED WITH POLARITY-INVERTING MEANS

Figure 1A:
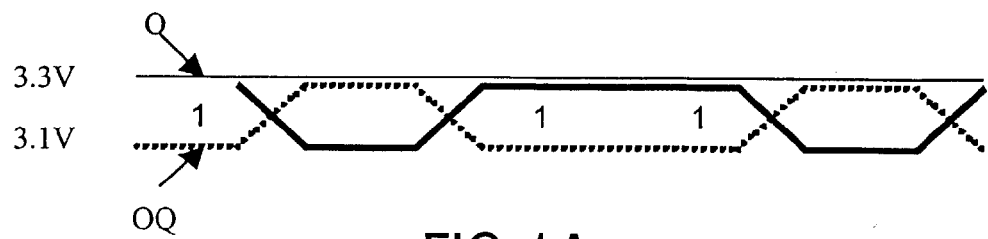

The invention relates to a switching device comprising a plurality of polarized input/output connections for transmitting pairs of polarized differential signals between at least one transmitter and one receiver, input/output connections being suitable for inverting the polarity in such a way that the polarity of the transmitted differential signal is inverted with respect to the polarity of said connection.

The invention also relates to an autoswitch for a transmission system using optical connections for realizing crossing points of a switching matrix.

The invention finds numerous applications, notably in the transmission systems using optical connections. It is particularly advantageous in applications for switching packets at high rates.

In the applications using integrated circuits, it is often difficult to reconcile the polarity of the differential signals transmitted between the different integrated circuits with the constraints of routing of the printed circuit on which these circuits are integrated. These constraints notably recommend avoidance of crossing wires on the printed circuit. To satisfy this recommendation, the manufacturers of integrated circuits often depart from the polarization constraints. This means that the connections between the circuits cannot respect the polarity of the transmitted signals. The fact that the polarity of the circuits is not respected may generate transmission errors. This is why it is necessary to compensate the polarizing faults in the circuits in an adequate manner so as to correct possible transmission errors.

The technical specification document of the circuit TZA3019, conceived by Philips Semiconductors, describes a switching device of the type mentioned in the opening paragraph. This device comprises means for inverting the polarity at the output of a switching matrix so as to invert the polarity of the differential signals supplied at the output in accordance with the configuration of the matrix. As a function of the application concerned, the configuration of the matrix is susceptible of varying in the course of time. To adapt to these variations by respecting the polarity of the transmitted signals, the inversion means must be reprogrammed in the course of their application as a function of the variations of the matrix configuration. The reprogramming of the polarity inverting means in the course of their application takes time, which is particularly disadvantageous, notably in the high rate applications and the applications of the packet-switching type where the configuration of the matrix varies frequently.

It is an object of the invention to provide an advantageous switching device which, for a given application, does not necessitate reprogramming of the polarity-inverting means as a function of the variations of the configuration of the switching matrix in the course of its application.

To this end, a device of the type described in the opening paragraph is provided, which comprises compensation means associated with the input/output connections for inverting the polarity of the input/output connections when said connections present a polarity inversion.

These and other aspects of the invention are apparent from and will be elucidated, by way of non-limitative example, with reference to the embodiment(s) described hereinafter.

Figure 1B:
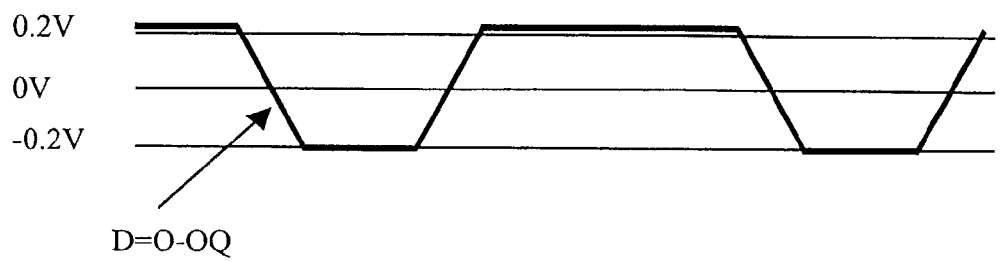

In the drawings:

FIG. 1A is a block diagram illustrating an example of a pair of differential signals used in a device according to the invention, FIG. 1B is a block diagram illustrating an example of differential signals D=O–OQ oscillating between the differential voltages 0.2 V and –0.2 V according to the invention.

Figure 2A:
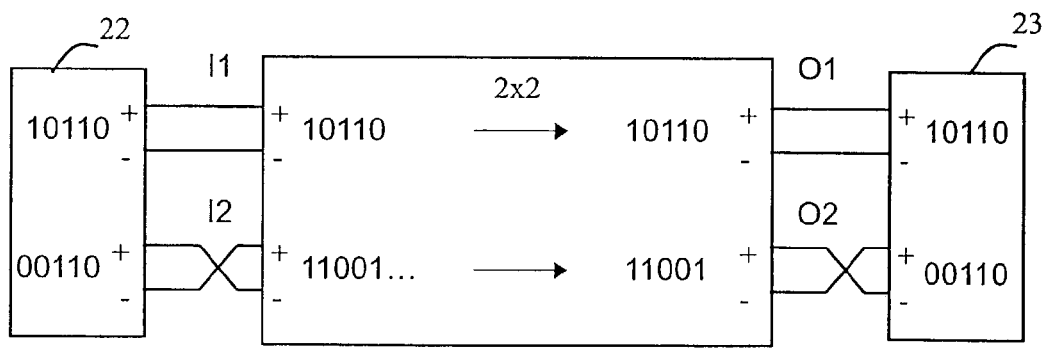
Figure 2B:
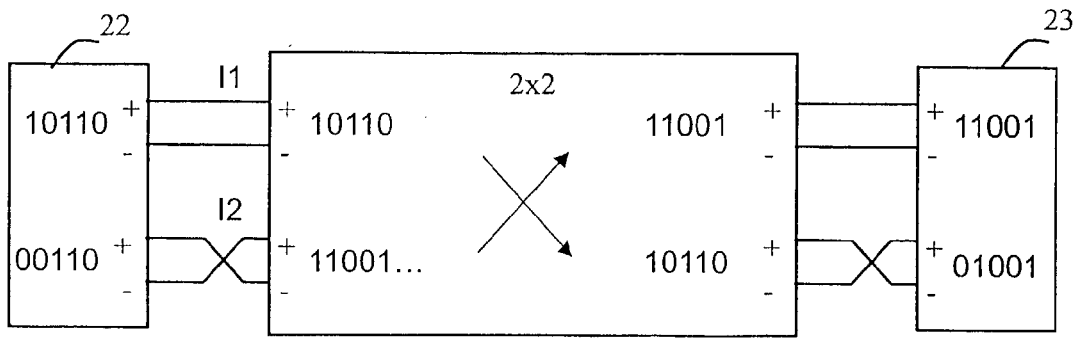
Figure 3A:
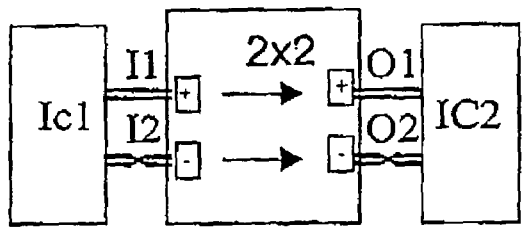
Figure 3B:
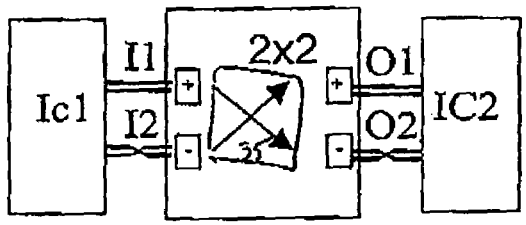
Figure 4:
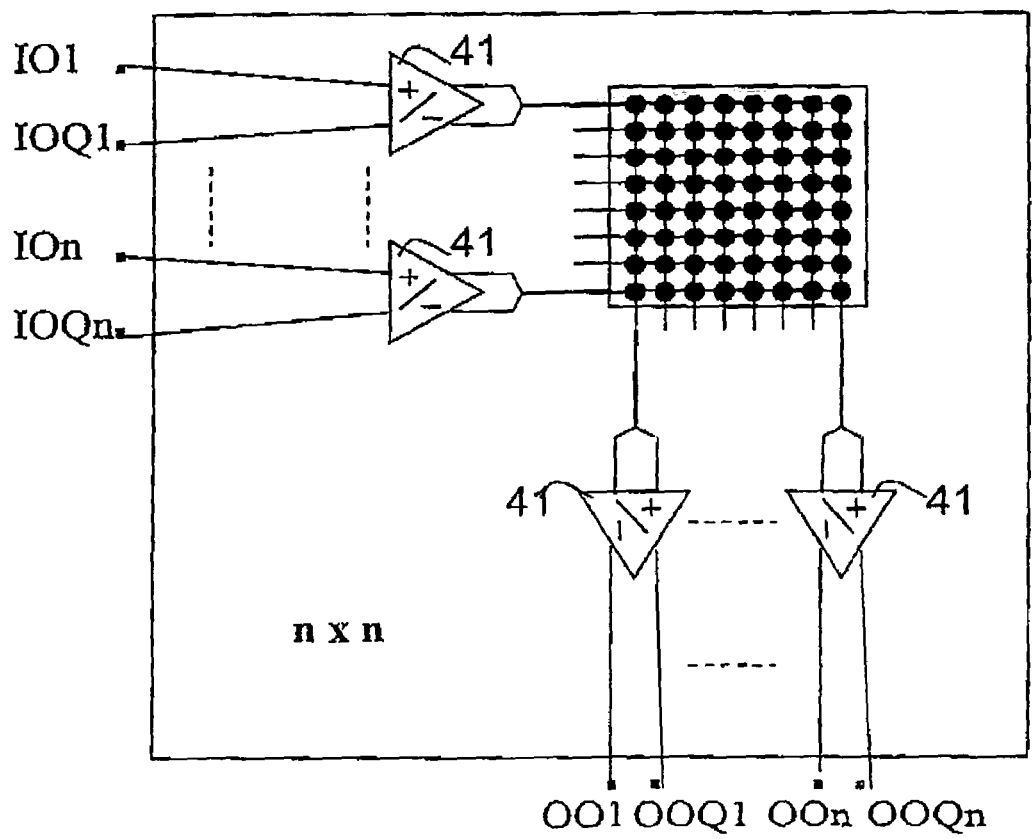
Figure 5:
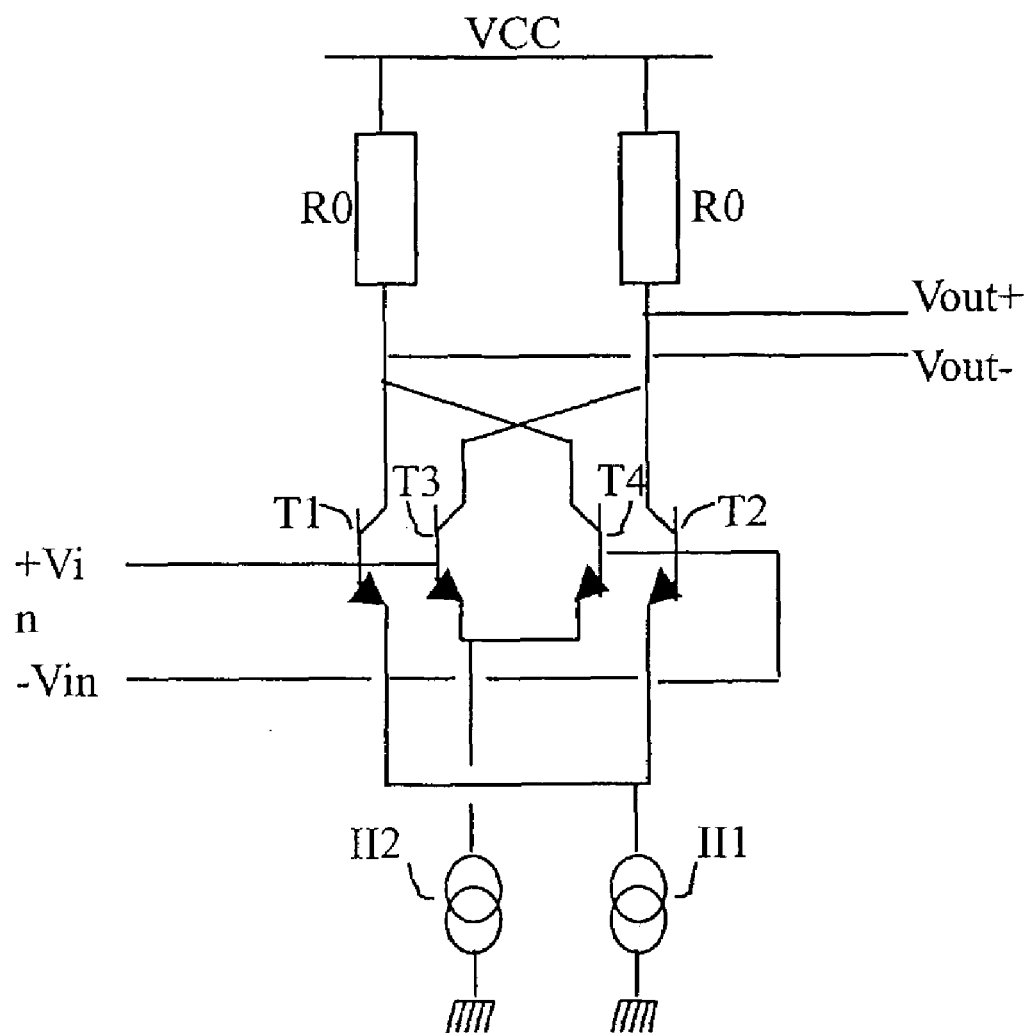

FIG. 2 is diagram illustrating the importance of the extent of polarity in a device according to the invention, using a 2×2 matrix in accordance with two different matrix configurations shown in FIGS. 2A and 2B, respectively, FIG. 3 is a block diagram showing an embodiment of a device according to the invention in two different configurations of the switching matrix, shown in FIGS. 3A and 3B, respectively, FIG. 4 is a diagram illustrating an embodiment of the device according to the invention, FIG. 5 is a diagram showing an embodiment of a means for inverting the polarity used in the device of FIG. 4.

In applications using integrated circuits functioning at a high rate, such as in optical transmissions, the transmitted signals are of the differential type. They are shown in FIG. 1A by means of a pair of complementary signals, referred to as components O and OQ of the differential signal denoted as D. The two components O and OQ of the differential signal D are simultaneously conveyed through two wires. Each component of the signal may be compared with a series of binary digital data of the "0" or "1" type. FIG. 1A illustrates an example using a binary coding of the NRZ type (non-return to zero). In this example, for the component 0, the voltages 3.3 V and 3.1 V show the values "1" and "0", respectively, and for the component OQ, it is the inverse value. FIG. 1B shows the resultant differential signal D=O-OQ oscillating between the differential voltages 0.2 V and –0.2 V which represent the values "1" and "0", respectively. A connection between 2 blocks changing differential signals must comply with polarity rules so as to avoid transmission errors.

FIG. 2 shows the importance of the extent of polarity in an example using a 2×2 switching matrix having two inputs I1 and I2 and two outputs O1 and O2 for connecting a transmitter 22 and a receiver 23. To comply with the routing constraints of signals conveyed in these types of applications, referred to as RF signals, the polarity constraints are not always respected, as is shown in FIGS. 2A and 2B at the level of the connections I2 and O2. In these cases, purely arbitrary examples are concerned to illustrate several possible situations. The wire crossings at the level of the connections I2 and O2 show a polarity inversion. This polarity inversion can be realized with or without physical crossings at the level of the connection. The crossings in the Figure are a representation of the polarity inversion. FIG. 2 illustrates the particular case of a 2×2 matrix to show the importance of the polarity in the transmission of messages between a transmitter and a receiver via a switching matrix. A 2×2 matrix is used as an example for reasons of brevity. However, the same reasoning is applicable to any type of matrix. In the example illustrated in FIG. 2, there are 2 possible configurations for the switching matrix. FIG. 2A shows a first configuration in which the input I1 is connected to the output O1 and the input I2 is connected to the output O2. FIG. 2B shows a second possible configuration in which the input I1 is connected to the output O2 and the input I2 is connected to the output O1. In each configuration, the same messages are sent by the transmitter 22 to the inputs I1 and I2, respectively. In accordance with the configuration concerned, different messages may be received by the receiver at the outputs O1 and O2 because of transmission errors introduced by the polarity inversions.

In FIG. 2A, the message "10110" is applied from the input I1 to the output O1. There is no polarity inversion in the message trajectory. The received message "10110" is correct because it is identical to the message sent. In FIG. 2A the message "00110" is always sent from the input I2 to the output O2. There are two successive polarity inversions in the message trajectory. The message received is always correct because of the compensation realized by the two successive inversions.

In the configuration illustrated in FIG. 2B, the polarity errors are no longer compensated and the received message is erroneous. Indeed, the input I1 is directed to the output O2, which introduces a single polarity inversion in the message trajectory. It is the same for the input I2 directed to the output O1. The messages received by the receiver are thus binary complements of the transmitted messages. Reading of the received messages is thus erroneous.

FIG. 3 shows an embodiment of a switching device according to the invention with which the polarity errors can be compensated in the connections at the input or the output of the switching matrix, regardless of the configuration of the matrix. To this end, the invention provides the addition of polarity compensation means at the inputs and outputs, which realize a polarity inversion because of the chosen routing. These compensation means realize a polarity inversion of the differential signal at the input and/or the output of the matrix when the polarity of the connection has been inverted during the implantation of integrated circuits on the printed circuit. FIGS. 3A and 3B show two examples of using the device according to the invention with a 2×2 switching matrix for connecting a transmitter circuit IC1 to a receiver circuit IC2, by means of the inputs I1, I2 and outputs O1 and O2. The embodiment shown in FIG. 3A corresponds to the configuration illustrated in FIG. 2A where the inputs I1 and I2 are directed towards the outputs O1 and O2, respectively. FIG. 3B represents another example corresponding to the configuration illustrated in FIG. 2B in which the inputs I1 and I2 are directed towards the crossing outputs O2 and O1, respectively. Polarity compensation circuits, represented by squares having a positive or negative sign, are present at the input and output of the switching matrix. The compensation circuits are polarized to realize an inversion at the level of the inputs and outputs exhibiting a polarity inversion, shown by way of crossed wires, i.e. the input I2 and the output O2 in FIGS. 2A and 2B.

In accordance wit a particularly advantageous variant of the invention, the inverters are controlled by control means 35 so as to allow modification of the polarity of each connection as a function of the application concerned, i.e. of the routing of the connections. Once the programming of the predetermined inverters given for a certain application, the polarity no longer varies during the time when the application is being used, regardless of the configuration of the matrix which may vary in the course of time.

FIG. 4 shows an embodiment of a device according to the invention using an nxn switching matrix comprising n inputs denoted I1 to In, and n outputs denoted O1 to On, each input and output comprising 2 differential components denoted O and OQ. Each input and output of the nxn matrix is connected to a circuit 41 for inverting the polarity +/− which is programmed in an adequate manner so as to invert the polarity of the connections exhibiting a polarity inversion which is inherent in the conception of these connections.

FIG. 5 shows an embodiment of the polarity inversion circuit 41 shown in FIG. 4. Other circuits may be used. The diagram in FIG. 5 shows a polarity inversion device intended to receive an input signal Vin and to supply an output signal Vout which is an image of Vin or an inverted image of Vin. Here, Vin represents one of the components O or OQ of the differential signals in the switching device shown in FIG. 4. The polarity switching device includes two differential pairs composed of transistors (T1, T2) and (T3, T4), respectively, whose conduction is controlled by the input signal Vin. The two differential pairs (T1, T2) and (T3, T4) are polarized by means of switchable current sources II1 and II2 intended to start a current in the first or the second differential pair as a function of the chosen program. Control means (not shown) are provided to control the switching of the current sources as a function of their application. The resistances R0 perform a current/voltage transformation of the current information coming from the differential pairs. When the current source II1 is excited and the current source II2 is extinct, the output signal Vout is an image of the input signal Vin, and when the current source II2 is excited and the current source II1 is extinct, the output signal Vout is an inverted image of the input signal Vin.

The invention claimed is:

1. A switching device comprising a plurality of polarized differential input/output connections for transmitting pairs of polarized differential signals between at least one transmitter and one receiver, said input/output connections being suitable for inverting the polarity in such a way that the polarity of the transmitted differential signal is inverted with respect to the polarity of said connection, wherein the device further comprises compensation means at both the input and output connections for automatically inverting the polarity of the input/output connections when said connections present a polarity inversion without reprogramming the compensation means; said compensation means comprising two differential pairs connected in parallel to a current source via a switch.

2. A device as claimed in claim 1, wherein the compensation means are programmable and are adapted to the input/output connections for inverting the polarity of each input/output connection which presents a polarity inversion.

3. A device as claimed in claim 2, comprising control means associated with the programmable compensation means so as to control the polarity of the input/output connections as a function of the polarity of the pairs of differential signals transmitted through said connections.

4. A device as claimed in claim 1, intended to be incorporated in an autoswitch of a transmission system using optical connections so as to realize crossing points of a switching matrix, the pairs of differential signals being optical signals.

5. An autoswitch for a transmission system using optical connections for realizing crossing points for a switching matrix, the autoswitch comprising a switching device as claimed in claim 1.

* * * * *